United States Patent
Jang et al.

(10) Patent No.: US 11,963,379 B2
(45) Date of Patent: Apr. 16, 2024

(54) DISPLAY DEVICE INCLUDING DRIVING CHIP AND ADHESIVE MEMBER SPACED APART FROM DRIVING CHIP AND METHOD OF FABRICATING DISPLAY DEVICE

(71) Applicant: Samsung Display Co., Ltd., Yongin-si (KR)

(72) Inventors: Euiyun Jang, Seoul (KR); Cheolgeun An, Yongin-si (KR); Wonjoon Choi, Yongin-si (KR); Jeongho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 183 days.

(21) Appl. No.: 16/376,187

(22) Filed: Apr. 5, 2019

(65) Prior Publication Data
US 2019/0319213 A1    Oct. 17, 2019

(30) Foreign Application Priority Data

Apr. 16, 2018 (KR) .................. 10-2018-0044145

(51) Int. Cl.
*H10K 50/842*  (2023.01)
*H10K 71/00*  (2023.01)
(Continued)

(52) U.S. Cl.
CPC ......... *H10K 50/8426* (2023.02); *H10K 71/00* (2023.02); *H10K 59/131* (2023.02); *H10K 59/40* (2023.02)

(58) Field of Classification Search
CPC . H01L 51/5246; H01L 51/56; H01L 51/5253; H01L 51/524; H01L 51/5237;
(Continued)

(56) References Cited

U.S. PATENT DOCUMENTS 6,151,091 A * 11/2000 Muramatsu ........... G02F 1/1345
349/149
8,530,253 B2    9/2013 Shin et al.
(Continued)

FOREIGN PATENT DOCUMENTS

CN    1224181 A    7/1999
CN    103794625 A    5/2014
(Continued)

OTHER PUBLICATIONS

Korean Office Action dated Jul. 13, 2022 in Korean Patent Application No. 10-2018-0044145.

*Primary Examiner* — David Chen
(74) *Attorney, Agent, or Firm* — H.C. Park & Associates, PLC

(57) ABSTRACT

A display device includes: a display panel including a display region and a non-display region; a window member on the display panel; and an adhesive member between the display panel and the window member. The adhesive member includes: a first adhesion portion overlapping the display region, and a second adhesion portion extending from the first adhesion portion and overlapping the non-display region. The display panel includes: a substrate, a display element layer on the substrate and overlapping the display region, a driving chip on the substrate and overlapping the non-display region, and an encapsulation member on the display element layer. The driving chip is configured to provide a driving signal to the display element layer. The first adhesion portion connects the window member to the encapsulation member. The second adhesion portion connects the window member to the substrate and encloses the driving chip, but does not overlap the driving chip.

12 Claims, 15 Drawing Sheets

(51) Int. Cl.
*H10K 59/131* (2023.01)
*H10K 59/40* (2023.01)

(58) Field of Classification Search
CPC . H01L 51/525; H01L 27/323; H01L 27/3276; H10K 50/8426; H10K 71/00; H10K 59/131; H10K 59/40
USPC ......... 257/40, 59, 33.059, 33.06; 438/28, 34
See application file for complete search history.

(56) References Cited

U.S. PATENT DOCUMENTS

| | | | |
|---|---|---|---|
| 9,029,847 B2 | 5/2015 | Lee et al. | |
| 9,601,721 B2 | 3/2017 | Lang et al. | |
| 2001/0044170 A1* | 11/2001 | Muramatsu | H01L 21/56 438/124 |
| 2008/0265745 A1* | 10/2008 | Pan | H01L 51/5253 313/500 |
| 2011/0182046 A1* | 7/2011 | Shiota | H05K 3/361 361/783 |
| 2011/0227848 A1* | 9/2011 | Furusawa | G06F 1/1626 345/173 |
| 2014/0192491 A1* | 7/2014 | Chiang | H05K 3/28 361/749 |
| 2015/0153594 A1* | 6/2015 | Sato | G02F 1/13306 349/122 |
| 2016/0072094 A1* | 3/2016 | Kim | H01L 51/529 315/112 |
| 2016/0365027 A1* | 12/2016 | Suh | G06F 3/0443 |
| 2017/0250228 A1* | 8/2017 | Liao | H10K 59/40 |
| 2018/0004330 A1* | 1/2018 | Kim | H10K 50/8426 |
| 2018/0026082 A1* | 1/2018 | Lee | G02F 1/134309 349/96 |
| 2018/0146555 A1* | 5/2018 | Kuo | H05K 1/148 |
| 2018/0183003 A1* | 6/2018 | Han | H01L 27/1255 |
| 2018/0308903 A1* | 10/2018 | Jeong | G06F 3/0446 |
| 2019/0131353 A1* | 5/2019 | Tang | G06F 3/0412 |
| 2019/0224954 A1 | 7/2019 | Jang et al. | |

FOREIGN PATENT DOCUMENTS

| | | |
|---|---|---|
| CN | 103875090 A | 6/2014 |
| CN | 103929880 A | 7/2014 |
| CN | 104335107 A | 2/2015 |
| KR | 10-1267529 | 5/2013 |
| KR | 10-2014-0083019 | 7/2014 |
| KR | 10-2015-0096876 | 8/2015 |
| KR | 10-2016-0030599 | 3/2016 |
| KR | 10-2016-0080973 | 7/2016 |
| KR | 10-1739136 | 5/2017 |
| KR | 10-2019-0090108 | 8/2019 |

* cited by examiner

DISPLAY DEVICE INCLUDING DRIVING CHIP AND ADHESIVE MEMBER SPACED APART FROM DRIVING CHIP AND METHOD OF FABRICATING DISPLAY DEVICE

CROSS-REFERENCE TO RELATED APPLICATION

This application claims priority from and the benefit of Korean Patent Application No. 10-2018-0044145, filed Apr. 16, 2018, which is hereby incorporated by reference for all purposes as if fully set forth herein.

BACKGROUND

Field

Exemplary embodiments generally relate to a display device, and more specifically, to a display device and a method of fabricating a display device.

Discussion

A display device typically includes a display panel and a window member protecting the display panel. The window member can be attached to a top surface of the display panel. The display panel is configured to generate an image, which is provided to a user through the window member. The display panel includes a display region, which is used to display an image, and a non-display region, which is not used to display an image. In general, the display region of the display panel is not spaced apart from the window member, but the non-display region of the display panel is spaced apart from the window member. Thus, in a case where an external impact is exerted to the display panel, the non-display region may be more easily broken as compared with the display region.

The above information disclosed in this section is only for understanding the background of the inventive concepts, and, therefore, may contain information that does not form

PRIOR ART

Summary

Some exemplary embodiments provide a display device capable of preventing a portion of an encapsulation substrate adjacent to a non-display region from being broken.

Some exemplary embodiments provide a method of fabricating a display device capable of preventing a portion of an encapsulation substrate adjacent to a non-display region from being broken.

Additional aspects will be set forth in the detailed description which follows, and, in part, will be apparent from the disclosure, or may be learned by practice of the inventive concepts.

According to some exemplary embodiments, a display device includes a display panel, a window member, and an adhesive member. The display panel includes a display region and a non-display region. The window member is on the display panel. The adhesive member is between the display panel and the window member. The adhesive member includes a first adhesion portion overlapping with the display region in a plan view, and a second adhesion portion extending from the first adhesion portion and overlapping with the non-display region in the plan view. The display panel includes a substrate, a display element layer on the substrate and overlapping with the display region, a driving chip on the substrate and overlapping with the non-display region, and an encapsulation member on the display element layer. The driving chip is configured to provide a driving signal to the display element layer. The first adhesion portion connects the window member to the encapsulation member. The second adhesion portion connects the window member to the substrate. The second adhesion portion encloses the driving chip, but does not overlap with the driving chip in the plan view.

In some exemplary embodiments, the first adhesion portion may be in contact with a top surface of the encapsulation member, and the second adhesion portion may be in contact with a side surface of side surfaces of the encapsulation member. The side surface may be adjacent to the driving chip. The second adhesion portion may be in contact with a portion of the top surface.

In some exemplary embodiments, the display panel may further include pads electrically connected to the driving chip. The pads may be on the substrate. The non-display region may include a chip region and a pad region. The driving chip may be on the chip region, and the pads may be on the pad region.

In some exemplary embodiments, when viewed in the plan view, the second adhesion portion may not overlap with either of the chip may be farther from the display region than the driving chip, and when viewed in the plan view, the second adhesion portion may overlap with a region between the chip region and the pad region.

In some exemplary embodiments, the display device may further include polarization member on the encapsulation member and overlapping with the display region. The first adhesion portion may include a first portion connecting the polarization member to the window member, and a second portion extending from the first portion and connecting a portion of a top surface of the encapsulation member to the window member.

In some exemplary embodiments, when viewed in the plan view, the second adhesion portion may be spaced apart from the driving chip.

In some exemplary embodiments, the display device may further include an input sensing unit on the encapsulation member, and a circuit board on the encapsulation member. The circuit board may be configured to provide a sensing driving signal to the input sensing unit.

In some exemplary embodiments, when viewed in the plan view, the second adhesion portion may not overlap with the circuit board.

According to some exemplary embodiments, a display device includes a display panel, a window member, and an adhesive member. The display panel includes a display region and a non-display region. The window member is on the display panel. The adhesive member is between the display panel and the window member. The adhesive member includes a first adhesion portion overlapping with the display region in a plan view, and a second adhesion portion extending from the first adhesion portion and overlapping with the non-display region in the plan view. The display panel includes a substrate, a display element layer on the substrate and overlapping with the display region, and an encapsulation member on the display element layer. The first adhesion portion connects the window member to the encapsulation member. The second adhesion portion is spaced apart from the substrate and is connected to the window member.

In some exemplary embodiments, in a thickness direction of the display panel, a thickness of the second adhesion portion may be greater than a thickness of the first adhesion portion In some exemplary embodiments, the display panel may further include a driving chip on the substrate and overlapping with the non-display region. The driving chip may be configured to provide a driving signal to the display element layer.

In some exemplary embodiments, the second adhesion portion may not contact the driving chip.

In some exemplary embodiments, the second adhesion portion may contact a top surface of the driving chip, but may not contact side surfaces of the driving chip.

In some exemplary embodiments, the display panel may further include pads on the substrate and electrically connected to the driving chip, and the second adhesion portion may not contact the pads.

According to some exemplary embodiments, a method of fabricating a display device includes: forming, using an inkjet printer, an adhesive member on a window member; coupling, using the adhesive member, the window member to a display panel; and irradiating the adhesive member with ultraviolet light to harden the adhesive member. The display panel includes a display region and a non-display region. The adhesive member includes a first adhesion portion overlapping with the display region, and a second adhesion portion extending from the first adhesion portion and overlapping with the non-display region. The inkjet printer is configured to form the second adhesion portion on the window member such that a thickness of the second adhesion portion is greater than a thickness of the first adhesion portion.

In some exemplary embodiments, the display panel may include a substrate, a display element layer on the substrate and overlapping with the display region, and an encapsulation member on the display element layer. The second adhesion portion may be formed on the window member such that the second adhesion portion is spaced apart from the substrate.

In some exemplary embodiments, the first adhesion portion may contact a top surface of the encapsulation member, and the second adhesion portion may contact a side surface of the encapsulation member.

In some exemplary embodiments, forming the adhesive member on the window member may include ejecting an adhesive material onto the window member using the inkjet printer, and irradiating the ejected adhesive material with ultraviolet light to harden the ejected adhesive material.

In some exemplary embodiments, the adhesive member may be an optically clear resin.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
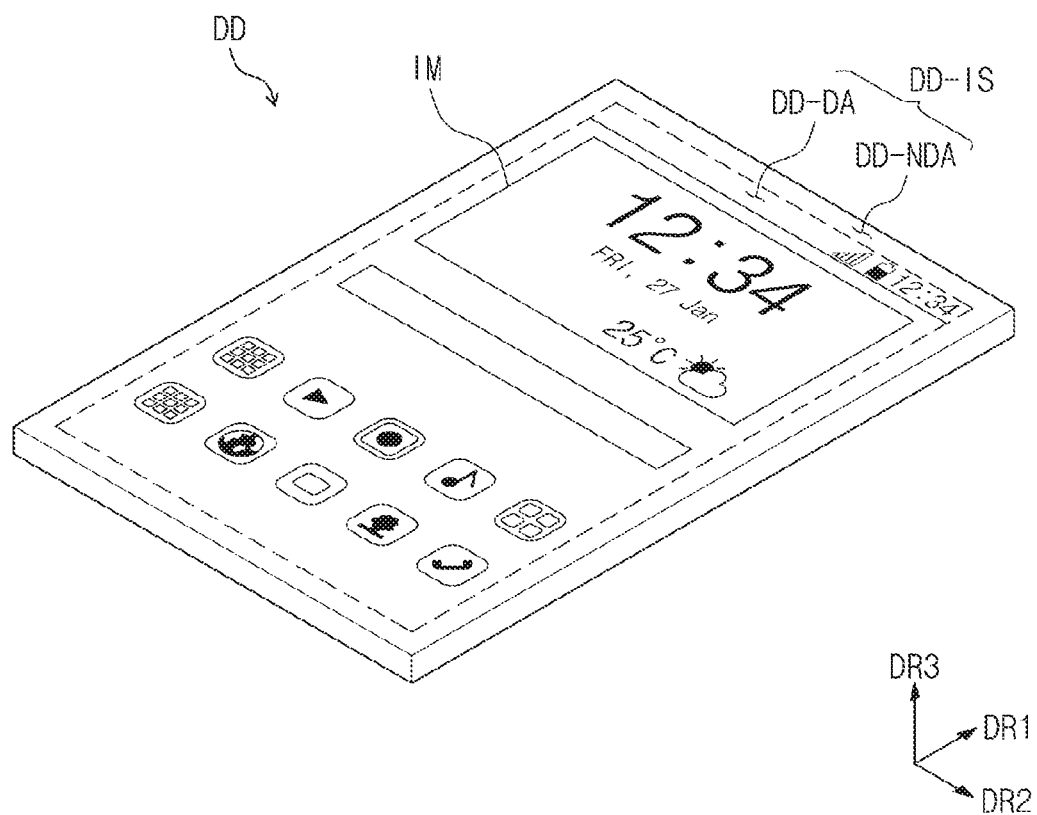
FIG. 1 is a perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
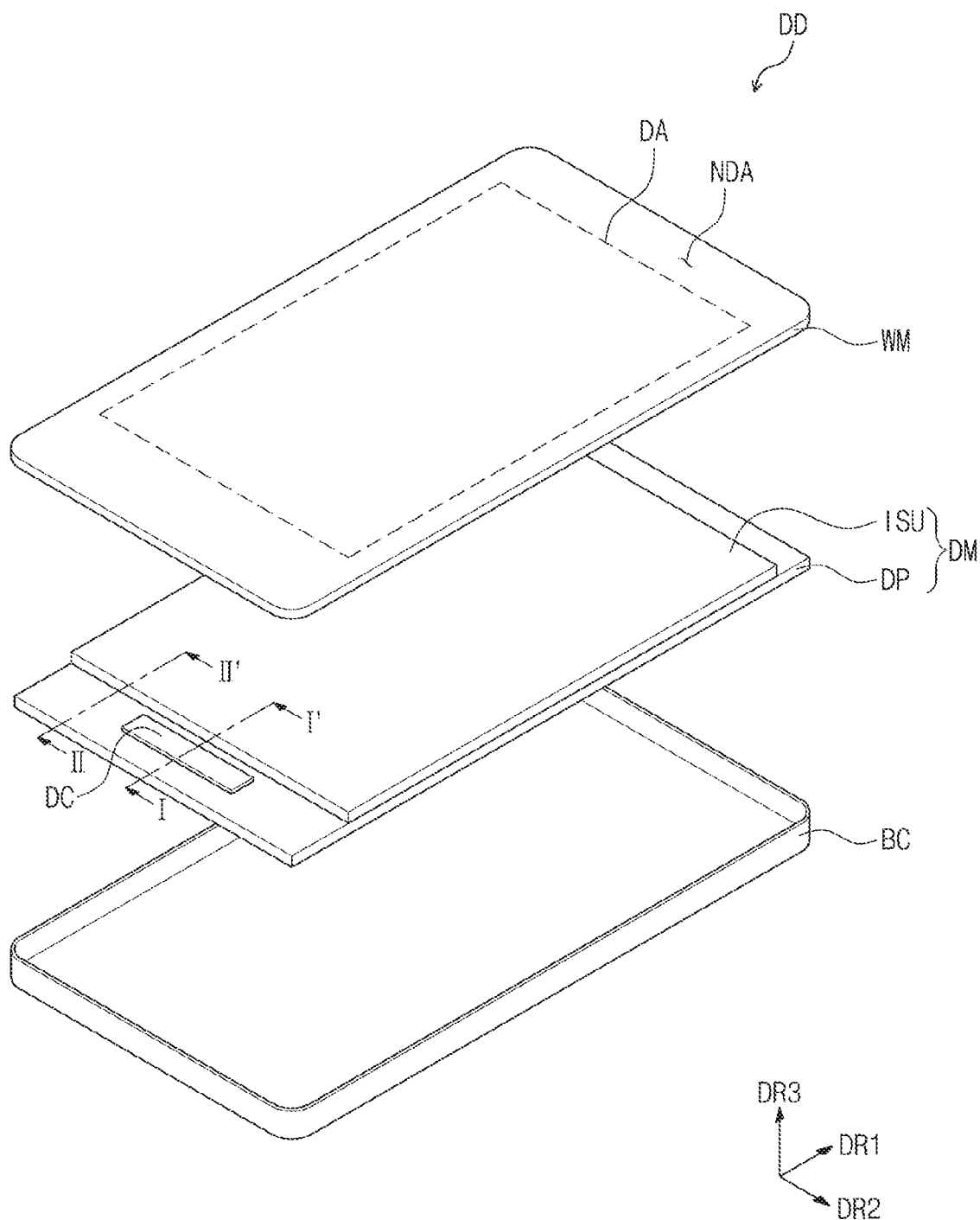
FIG. 2 is an exploded perspective view of a display device according to some exemplary embodiments.
Figure 3:
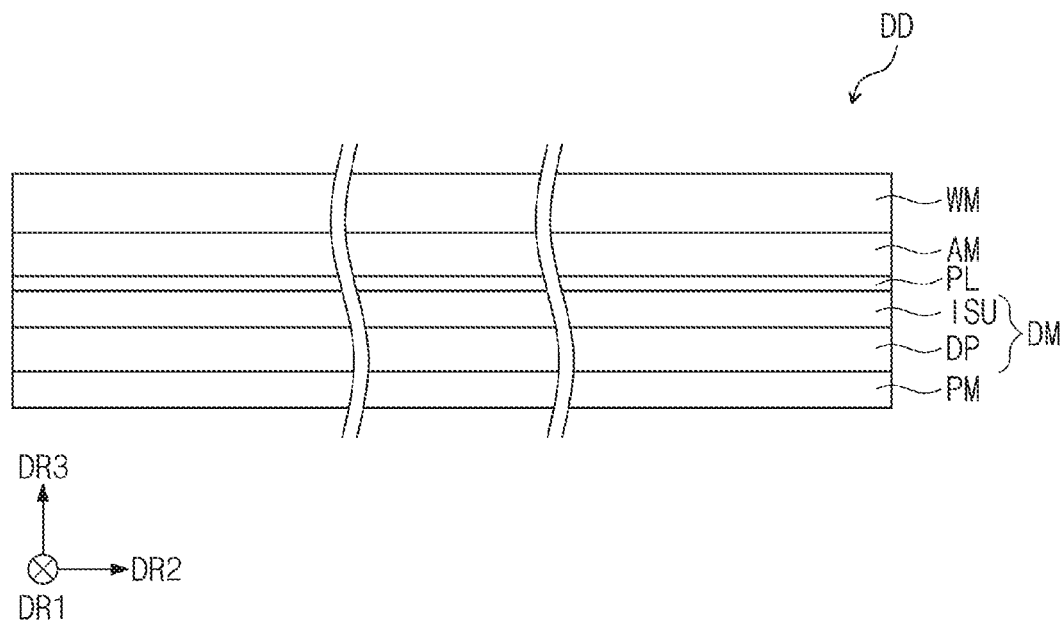
FIG. 3 is a sectional view of a display device according to some exemplary embodiments.

FIG. 1 is a perspective view of a display device according to some exemplary embodiments. FIG. 2 is an exploded perspective view of a display device according to some exemplary embodiments. FIG. 3 is a sectional view of a display device according to some exemplary embodiments.

As shown in FIG. 1, a display device DD may include a display surface DD-IS, which is used to display an image IM. The display surface DD-IS may be defined parallel to a plane defined by a first direction DR1 and a second direction DR2. A normal direction of the display surface DD-IS (e.g., a thickness direction of the display device DD) will be referred to as a third direction DR3. Hereinafter, the third direction DR3 may be used to differentiate a front or top surface of each element from a back or bottom surface. However, directions indicated by the first to third directions DR1, DR2, and DR3 may not be limited to this example, and, in some exemplary embodiments, the first to third directions DR1, DR2, and DR3 may be changed to indicate other directions.

In FIG. 1, the display device DD is illustrated to have a flat display surface, but exemplary embodiments are not limited to this example. The display device DD may include a curved or three-dimensional display surface. In the case where the display device DD has a three-dimensional display surface, the display surface may include a plurality of display regions that are oriented in different directions. For example, the display device DD may have a display surface that is shaped like a surface of a polygonal pillar.

According to some exemplary embodiments, the display device DD may be a rigid display device; however, exemplary embodiments are not limited thereto. In some exemplary embodiments, the display device DD may be a flexible display device. Further, the display device DD may be used for a cellphone terminal, but exemplary embodiments are not limited thereto. Although not shown, a mainboard mounted with electronic modules, a camera module, a power module, and so forth, along with the display device DD, may be provided in a bracket or case to constitute a cellphone terminal. The display device DD may be used for large-sized electronic devices (e.g., television sets, monitors, etc.) or small- or medium-sized electronic devices (e.g., tablets, car navigation systems, game machines, smart watches, etc.).

As shown in FIG. 1, the display surface DD-IS may include a display region DD-DA, which is used to display the image IM, and a non-display region DD-NDA, which is provided adjacent to the display region DD-DA. The non-display region DD-NDA may not be used to display an image. As an example of the image IM, icon images are shown in FIG. 1.

As shown in FIG. 1, the display region DD-DA may have a rectangular shape, and the non-display region DD-NDA may be provided to surround the display region DD-DA. However, exemplary embodiments are not limited to this example, and in some exemplary embodiments, the non-display region DD-NDA may be provided adjacent to only a portion of the display region DD-DA or may be omitted.

Referring to FIG. 2, the display device DD may include a window member WM, a display module DM, a driving chip DC, and a container element BC.

The window member WM may be provided on the display module DM and may include a display region DA, which is configured to allow an image from the display module DM to pass therethrough. The window member WM may be formed of, for example, glass, sapphire, plastic, or the like. The window member WM may include the display region DA and a non-display region NDA that overlap with the display region DD-DA and the non-display region DD-NDA, respectively, of the display device DD.

Although FIG. 2 illustrates an example in which the window member WM has a single-layered structure, the window member WM may include a plurality of layers. As an example, the window member WM may include a base layer and at least one bezel layer, which is provided on a bottom surface of the base layer and at a region corresponding to the non-display region DD-NDA.

The display module DM may be provided between the window member WM and the container element BC. The display module DM may include a display panel DP and an input sensing unit ISU. The input sensing unit ISU may be provided between the window member WM and the display panel DP.

The description that follows will refer to an example in which the display panel DP is an organic light emitting display panel. However, exemplary embodiments are not limited to this example, and in some exemplary embodiments, any suitable display panel may be used.

The display panel DP may be configured to generate an image (e.g., the image IM) and then to transmit the image toward the window member WM. The display panel DP may be overlapped with the display region DD-DA.

The input sensing unit ISU may be configured to sense a user input from the outside. The user input may include various types of external inputs, such as a part of a user's body, light, heat, or pressure. The input sensing unit ISU may be directly provided on the display panel DP. In some exemplary embodiments, the input sensing unit ISU and the display panel DP may be fabricated through a consecutive process. However, exemplary embodiments are not limited to this example, and in some exemplary embodiments, the input sensing unit ISU may be provided in the form of an individual panel and may be coupled to the display panel DP using an adhesive member. In some exemplary embodiments, the input sensing unit ISU may be omitted.

Although not shown, the display module DM may further include an anti-reflection layer. The anti-reflection layer may include a color filter, a structure in which a conductive layer, a dielectric layer, and a conductive layer are stacked, or an optical member. The anti-reflection layer may be configured to absorb light incident from the outside or to reduce optical reflectance of the light through destructive interference or polarization of the light.

Referring to FIG. 3, the display device DD may include a protection member PM, the display module DM, a polarization member PL, an adhesive member AM, and the window member WM.

The display module DM may be provided between the protection member PM and the polarization member PL. The adhesive member AM may be used to attach the window member WM to the polarization member PL. In addition, the adhesive member AM may be used to attach the window member WM to the display module DM.

The adhesive member AM may be an optically clear adhesive (OCA) film, an optically clear resin (OCR) film, or a pressure sensitive adhesive (PSA) film. The description that follows will refer to an example in which the OCR film is used as the adhesive member AM.

The polarization member PL may be configured to polarize light emitted from the display panel DP. The polarization member PL may be provided on the input sensing unit ISU. In a case where the input sensing unit ISU is omitted, the polarization member PL may be provided on the display panel DP.

The protection member PM may be configured to prevent external moisture from infiltrating the display module DM and to absorb an external impact. The protection member PM may include a plastic film serving as a base layer. The protection member PM may include, for instance, a plastic film containing one selected from the group consisting of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), poly(arylene ether sulfone), and any combination thereof.

Materials for the protection member PM are not limited to plastic resins, and various organic/inorganic composites may be used for the protection member PM. The protection member PM may include a porous organic layer and an inorganic material, which is formed to fill pores of the organic layer. The protection member PM may further include a functional layer (not shown) formed on the plastic film. The functional layer may include a resin layer and may be formed by a coating method.

Figure 4:
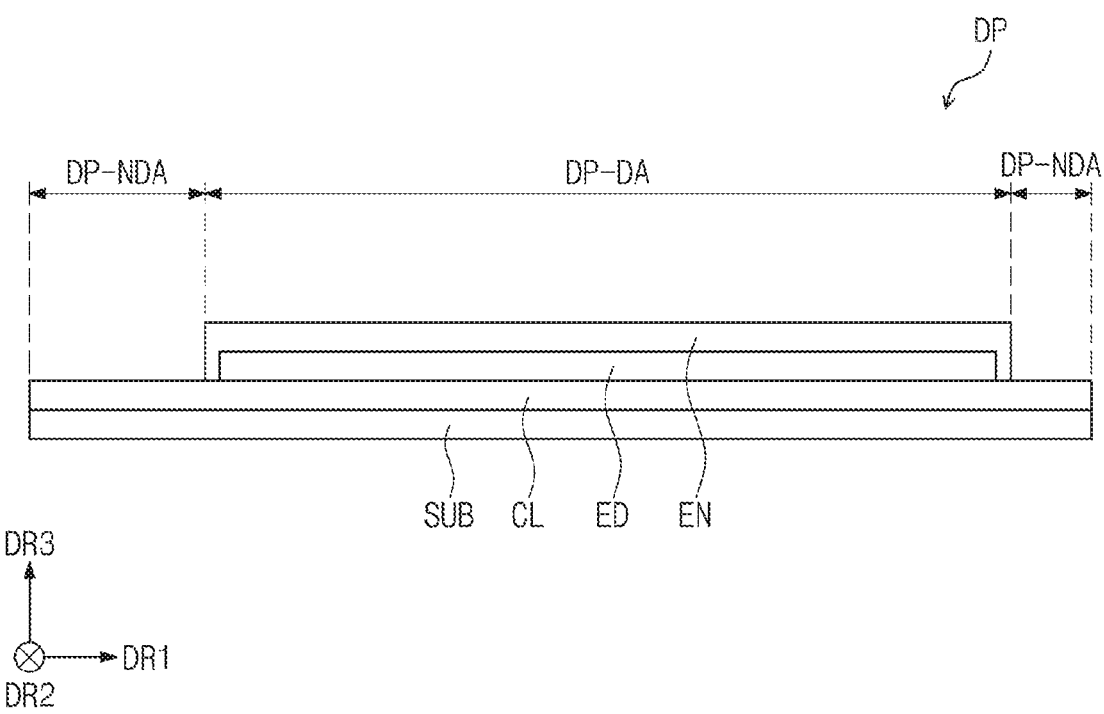
FIG. 4 is a sectional view of a display panel according to some exemplary embodiments.
Figure 5:
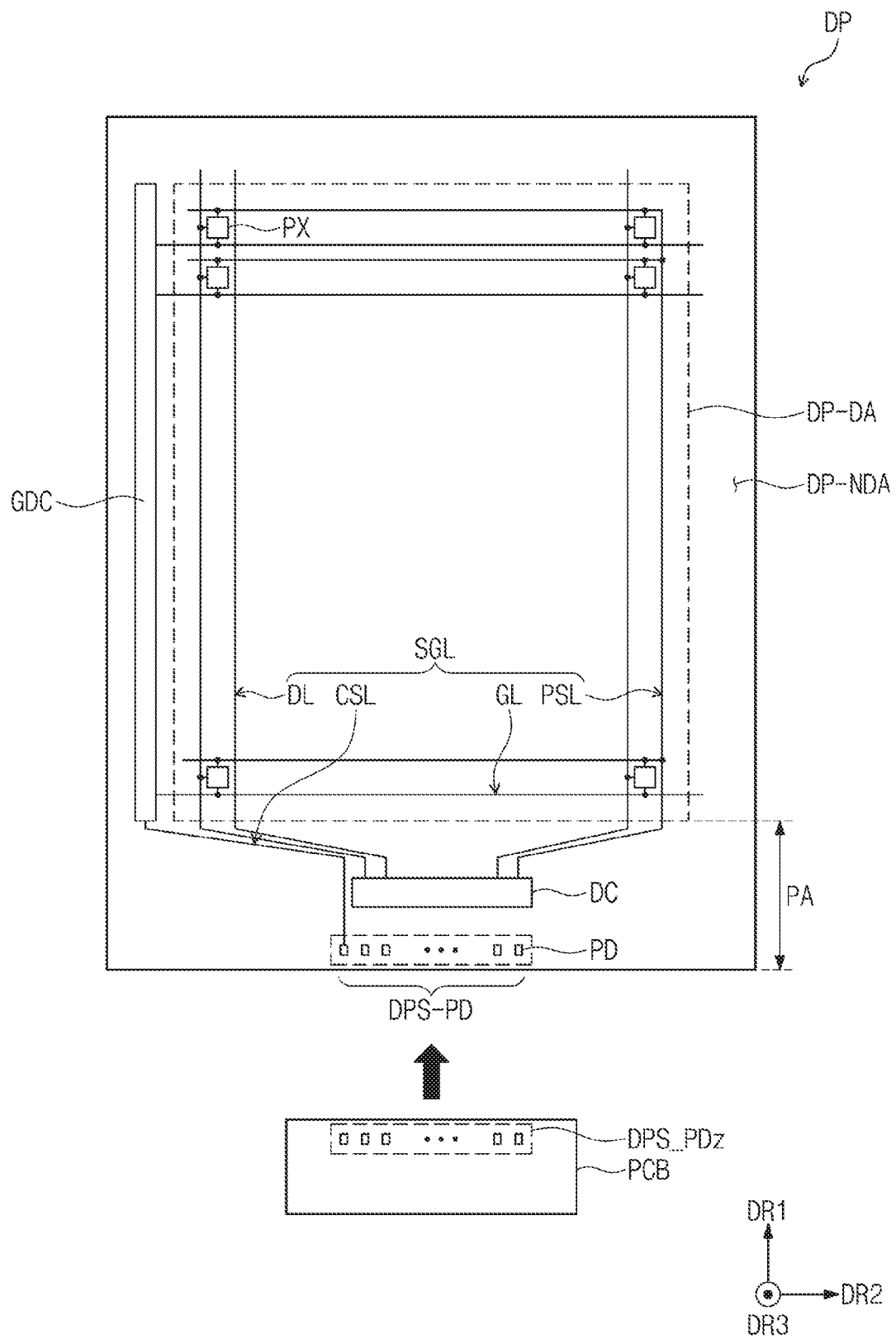
FIG. 5 is a plan view of a display panel according to some exemplary embodiments.

FIG. 4 is a sectional view of a display panel according to some exemplary embodiments. FIG. 5 is a plan view of a display panel according to some exemplary embodiments.

Referring to FIG. 4, the display panel DP may include a display region DP-DA and a non-display region DP-NDA. The display and non-display regions DP-DA and DP-NDA of the display panel DP may be overlapped with the display and non-display regions DD-DA and DD-NDA, respectively, of the display device DD.

The display panel DP may include a substrate SUB, and a circuit layer CL, a display element layer ED, and an encapsulation substrate EN that are provided on the substrate SUB. The substrate SUB may include at least one plastic film. The substrate SUB may include one of various flexible substrates, such as a plastic substrate, a glass substrate, a metal substrate, or a substrate made of an organic/inorganic composite material.

The circuit layer CL may be provided on the substrate SUB to be overlapped with the display and non-display regions DP-DA and DP-NDA. Although not shown, the circuit layer CL may include a plurality of insulating layers, a plurality of conductive layers, and a semiconductor layer. The conductive layers of the circuit layer CL may be used as signal lines or as a part of a control circuit of a pixel.

The display element layer ED may be provided on the substrate SUB to be overlapped with the display region DP-DA, and may include a plurality of organic light emitting diodes (not shown) serving as light emitting elements. The display element layer ED may further include an organic layer (not illustrated), such as a pixel definition layer.

The encapsulation substrate EN may be provided on the display element layer ED to be overlapped with the display region DP-DA. The encapsulation substrate EN may be configured to hermetically seal the display element layer ED and to prevent external moisture from entering the display element layer ED. The encapsulation substrate EN may be formed of, for example, glass, sapphire, plastic, or the like.

Referring to FIG. 5, the display panel DP may include a driving circuit GDC, a plurality of signal lines SGL, the driving chip DC, a plurality of pads PD, and a plurality of pixels PX. The pixels PX may be arranged in the display region DP-DA. Although not shown, each of the pixels PX may include an organic light emitting diode and a pixel driving circuit connected thereto. The driving circuit GDC, the signal lines SGL, the pads PD, the driving chip DC, and the pixel driving circuit may be included in the circuit layer CL of FIG. 4.

The driving circuit GDC may include a scan driving circuit. The scan driving circuit may be configured to generate a plurality of scan signals and to sequentially output the scan signals to a plurality of scan lines GL to be described below. The scan driving circuit may also be configured to output other additional control signals to a driving circuit for the pixels PX.

Although not shown, the scan driving circuit may include a plurality of thin-film transistors, which are formed by the same method as that for the driving circuit of the pixels PX or by, for example, a low-temperature polycrystalline silicon (LTPS) or low-temperature polycrystalline oxide (LTPO) process.

The signal lines SGL may be overlapped with the display and non-display regions DP-DA and DP-NDA. The signal lines SGL may include scan lines GL, data lines DL, a power line PSL, and a control signal line CSL. Each of the scan lines GL may be connected to corresponding ones of the pixels PX, and each of the data lines DL may be connected to corresponding ones of the pixels PX. The power line PSL may be connected to the pixels PX. The control signal line CSL may be used to provide control signals to the scan driving circuit.

Furthermore, the control signal line CSL of the signal lines SGL may be connected to a corresponding one of the pads PD, and the data lines DL and the power line PSL may be connected to the driving chip DC. Although not shown, signal lines, which electrically connect the driving chip DC to the pads PD provided in a pad region DPS-PD, may be further provided on the substrate SUB to be overlapped with the non-display region DP-NDA.

The driving chip DC may be configured to provide driving signals to the data lines DL and the power line PSL.

A portion of a circuit board PCB may be provided on the pads PD. The pads PD may be electrically connected to the circuit board PCB and may be used to provide the driving signals, which are transmitted from the circuit board PCB, to the driving chip DC. The circuit board PCB may be rigid or flexible. In a case where the circuit board PCB is flexible, the circuit board PCB may be provided in the form of a flexible printed circuit board. Further, the circuit board PCB may include driving pads DPS_PDz. When viewed in a plan view, the driving pads DPS_PDz may be overlapped with the pads PD and may be electrically connected to the pads PD. Hereinafter, a region of the non-display region DP-NDA, on which the driving chip DC and the pads PD are provided, will be referred to as a driving region PA.

Figure 6A:
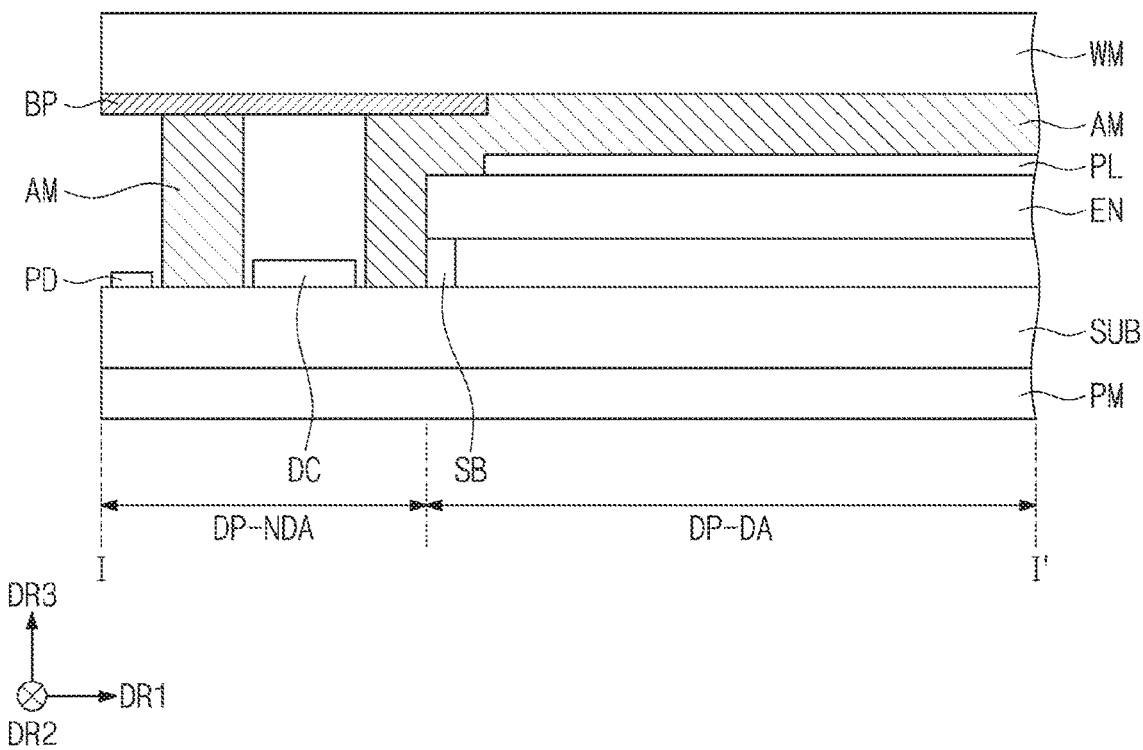
FIG. 6A is a sectional view taken along sectional line I-I' of FIG. 2 according to some exemplary embodiments.
Figure 6B:
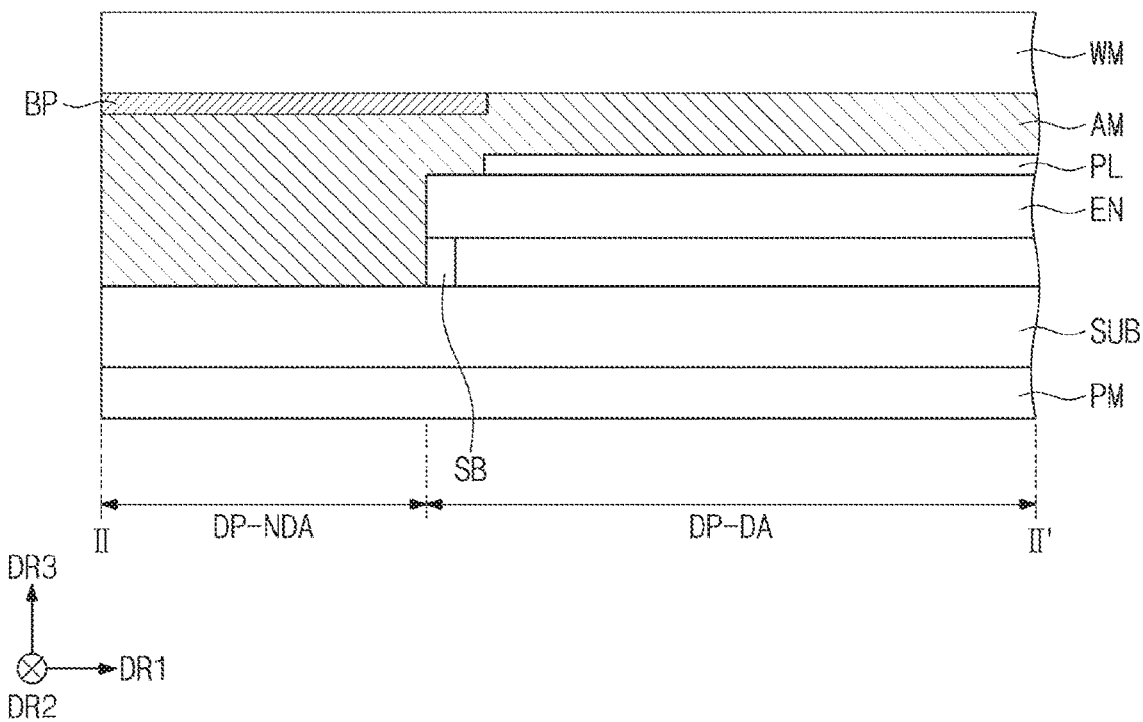
FIG. 6B is a sectional view taken along sectional line II-IT of FIG. 2 according to some exemplary embodiments.
Figure 7:
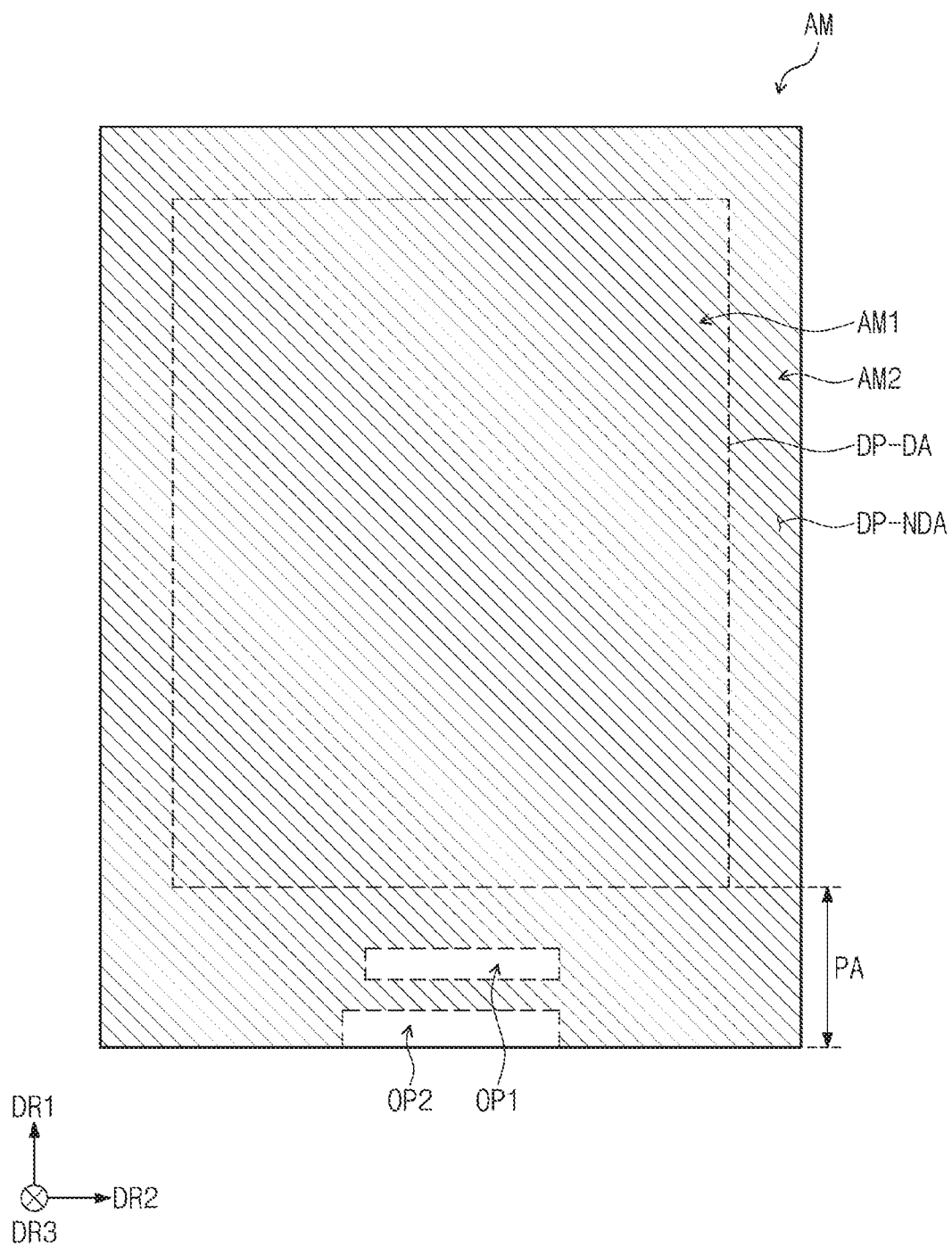
FIG. 7 is a plan view of an adhesive member according to some exemplary embodiments.

FIG. 6A is a sectional view taken along sectional line I-I' of FIG. 2 according to some exemplary embodiments. FIG. 6B is a sectional view taken along sectional line II-IT of FIG. 2 according to some exemplary embodiments. FIG. 7 is a plan view of an adhesive member according to some exemplary embodiments.

The input sensing unit ISU of FIG. 2 is omitted in FIGS. 6A, 6B, and 7. The non-display region DP-NDA of FIGS. 6A and 6B may correspond to the driving region PA of FIG. 5.

Referring to FIG. 6A, as described above, the protection member PM may be provided below the substrate SUB, which is the lowermost element of the display panel DP, and may be used to protect the display device DD from external damage. The encapsulation substrate EN may be provided on the substrate SUB to be overlapped with the display region DP-DA. A seal member SB may be provided along an edge of the encapsulation substrate EN to connect the encapsulation substrate EN to the substrate SUB. The polarization member PL may be provided on the encapsulation substrate EN to be overlapped with the display region DP-DA.

The substrate SUB, the encapsulation substrate EN, and the seal member SB may be provided to define an internal space. Here, the internal space may be provided between the substrate SUB and the encapsulation substrate EN. The internal space may be provided to have low pressure;

however, exemplary embodiments are not limited to this example, and in some exemplary embodiments, the internal space may be filled with nitrogen gas ($N_2$) or an insulating material. The display element layer ED and the circuit layer CL, which are overlapped with the display region DP-DA as previously described with reference to FIG. 4, may be provided in the internal space.

When viewed in a plan view, the driving chip DC and the pad PD may be spaced apart from each other and may be provided on the substrate SUB to be overlapped with the non-display region DP-NDA. When viewed in a plan view, the driving chip DC may be provided on the substrate SUB and between the pad PD and the display region DP-DA.

A light blocking member BP may be provided on a rear surface of the window member WM to be overlapped with the non-display region DP-NDA. The light blocking member BP may be formed of or include a light absorbing material, such as carbon black. Although the light blocking member BP is illustrated as on the rear surface of the window member WM and overlapped with the non-display region DP-NDA, exemplary embodiments are not limited to this example. In other words, the position and arrangement of the light blocking member BP may be variously changed.

The adhesive member AM may be provided between the window member WM and the display panel DP and may be used to attach the window member WM to the display panel DP. For example, on the display region DP-DA, the adhesive member AM may be used to connect the window member WM to the polarization member PL and to connect the window member WM to a top surface of the encapsulation substrate EN.

Meanwhile, in a case where an adhesive member connecting a window member to an encapsulation substrate is omitted from the non-display region, a magnitude of an external impact to be exerted on the encapsulation substrate may be increased. For example, when an external impact is exerted on a display device, the external impact may be exerted on a side surface of the encapsulation substrate adjacent to the non-display region, thereby causing breakage of the encapsulation substrate.

According to some exemplary embodiments, the adhesive member AM may connect the window member WM to the substrate SUB even on the non-display region DP-NDA. For example, the adhesive member AM may be used to attach the window member WM to the substrate SUB on the non-display region DP-NDA.

When viewed in a plan view, as shown in FIG. 7, the adhesive member AM may include a first adhesion portion AM1 overlapped with the display region DP-DA and a second adhesion portion AM2 overlapped with the non-display region DP-NDA. The second adhesion portion AM2 may be a portion extended from the first adhesion portion AM1, and for example, the first adhesion portion AM1 and the second adhesion portion AM2 may be provided in the form of a single body.

For instance, the first adhesion portion AM1 may be in contact with the top surface of the encapsulation substrate EN, and the second adhesion portion AM2 may be in contact with one of the side surfaces of the encapsulation substrate EN adjacent to the driving chip DC. The adhesive member AM may be provided to cover the encapsulation substrate EN on the whole. Thus, the adhesive member AM may be configured to protect the encapsulation substrate EN from an external impact, and this may make it possible to improve durability of the encapsulation substrate EN.

The first adhesion portion AM1 may include a first portion, which is used to connect the window member WM to the polarization member PL, and a second portion, which is extended from the first portion and is used to connect the window member WM to a portion of the top surface of the encapsulation substrate EN. The second portion of the first adhesion portion AM1 may be connected to the second adhesion portion AM2. When viewed in a plan view, the first adhesion portion AM1 may be overlapped with the display region DP-DA on the whole.

In some exemplary embodiments, the second adhesion portion AM2 may not be overlapped with the driving chip DC and the pad PD, when viewed in a plan view. Furthermore, in a thickness direction of the substrate SUB, a thickness of the second adhesion portion AM2 may be greater than a thickness of the first adhesion portion AM1.

As shown in FIG. 7, the second adhesion portion AM2 may include a first opening OP1 corresponding to a chip region provided with the driving chip DC and a second opening OP2 corresponding to the pad region DPS-PD (e.g., see FIG. 5) provided with the pad PD. When viewed in a plan view, the second adhesion portion AM2 may be overlapped with a region between the driving chip DC and the pad PD.

According to some exemplary embodiments, the driving chip DC and the pad PD may be provided on a region of the substrate SUB overlapped with the non-display region DP-NDA, but exemplary embodiments are not limited to this example. A plurality of driving devices, which are configured to provide driving signals to the circuit layer CL or the display element layer ED, may be further provided on the region of the substrate SUB overlapped with the non-display region DP-NDA. In this case, the driving devices may also not be overlapped with the second adhesion portion AM2, when viewed in a plan view.

In a case where the second adhesion portion is formed on the entire region of the non-display region, a part or ingredient of an adhesive material may be absorbed into the driving chip when the second adhesion portion is formed. The adhesive material may lead to malfunction or damage of the driving chip.

By contrast, according to some exemplary embodiments, the second adhesion portion AM2 may be provided on the substrate SUB in such a way that the second adhesion portion AM2 is not overlapped with the chip region provided with the driving chip DC and the pad region DPS-PD provided with the pad PD. In addition, when viewed in a plan view, the second adhesion portion AM2 may be spaced apart from the driving chip DC by a specific distance. As a result, it may be possible to prevent an adhesive material from entering the driving chip DC or the pad PD when the second adhesion portion AM2 is formed.

Referring to FIG. 6B, on a remaining region of the non-display region DP-NDA that is not overlapped with the driving chip DC and the pad PD, the second adhesion portion AM2 may be provided to connect the substrate SUB to the window member WM. On the remaining region of the non-display region DP-NDA, the second adhesion portion AM2 may be provided to substantially fill a space between the window member WM and the substrate SUB. As a result, when an external impact is exerted on the display device DD, the external impact may be absorbed or buffered by the second adhesion portion AM2 on the non-display region DP-NDA, and thus, the encapsulation substrate EN may be prevented from being damaged.

Figure 8:
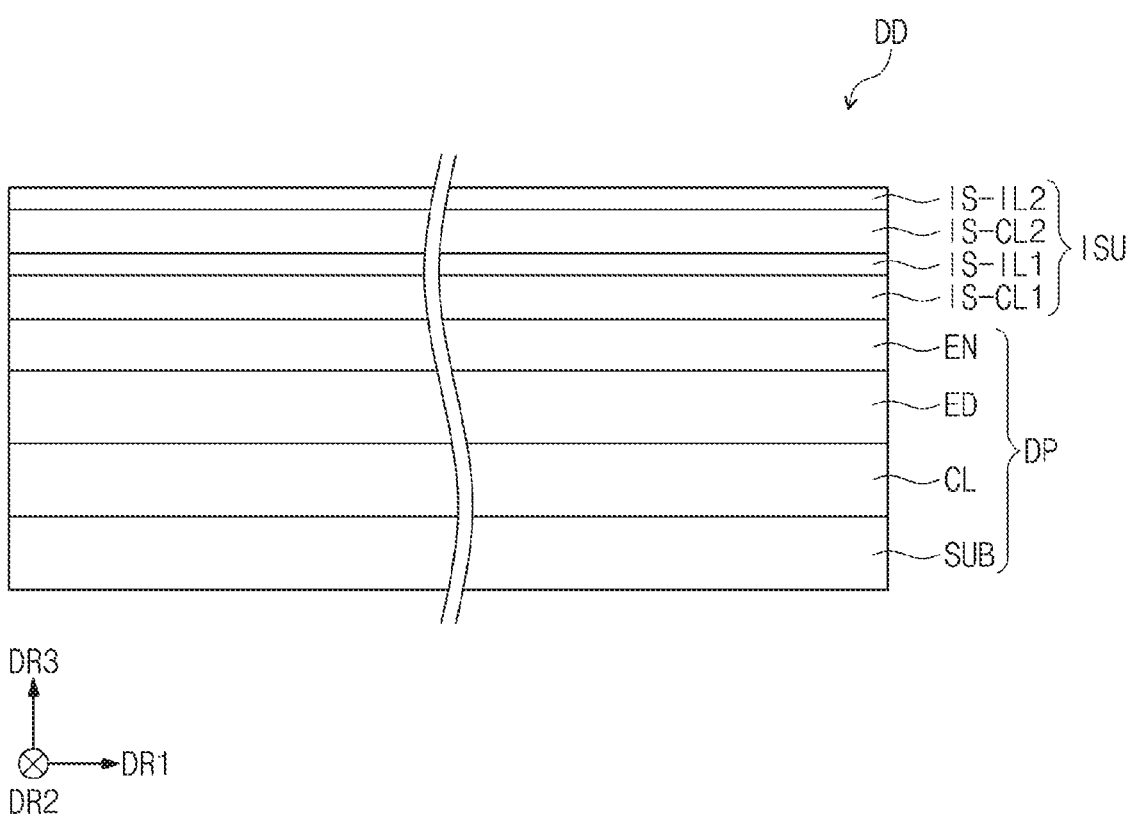
FIG. 8 is a sectional view of a display device according to some exemplary embodiments.
Figure 9:
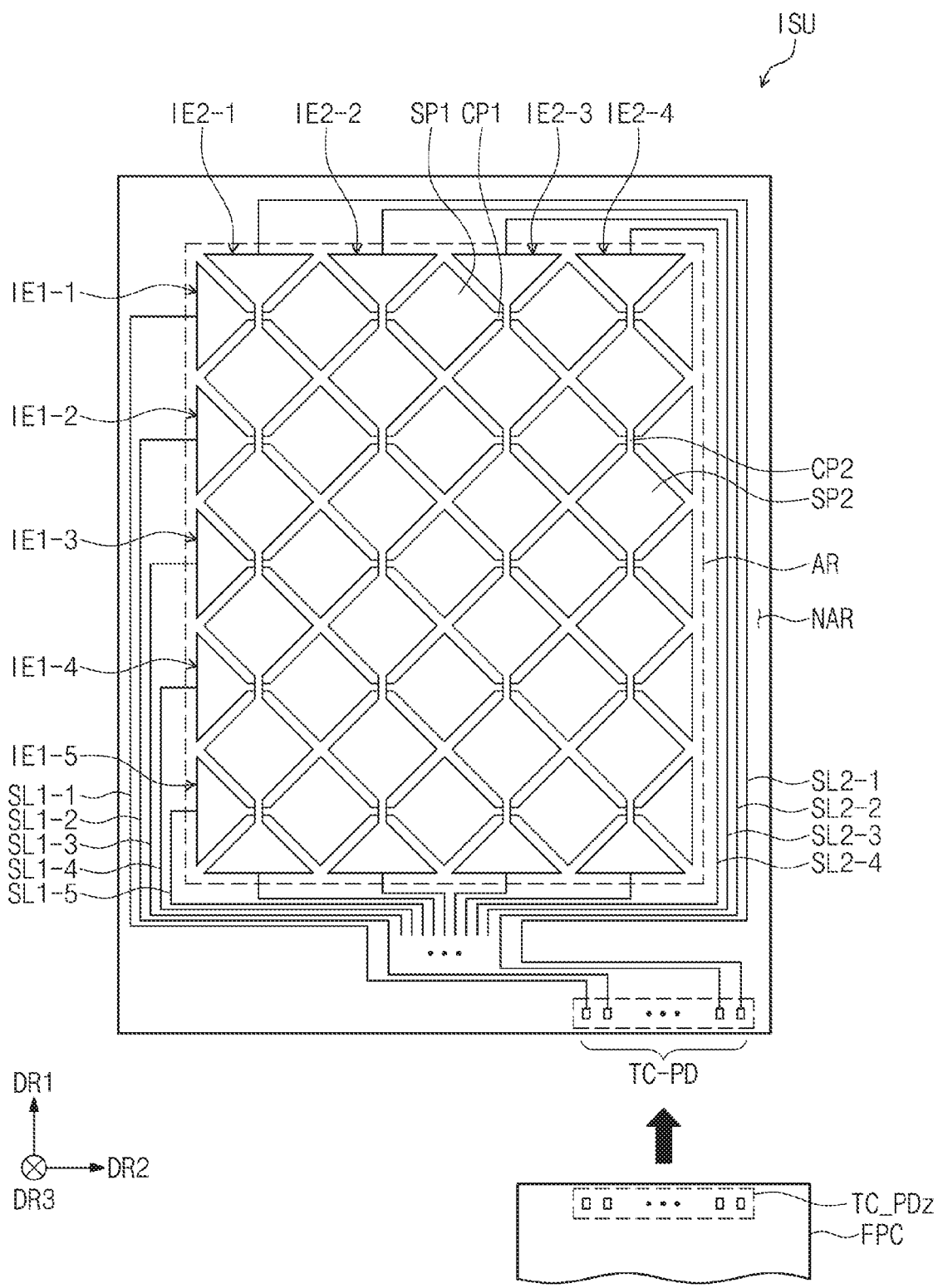
FIG. 9 is a plan view of an input sensing unit according to some exemplary embodiments.
Figure 10:
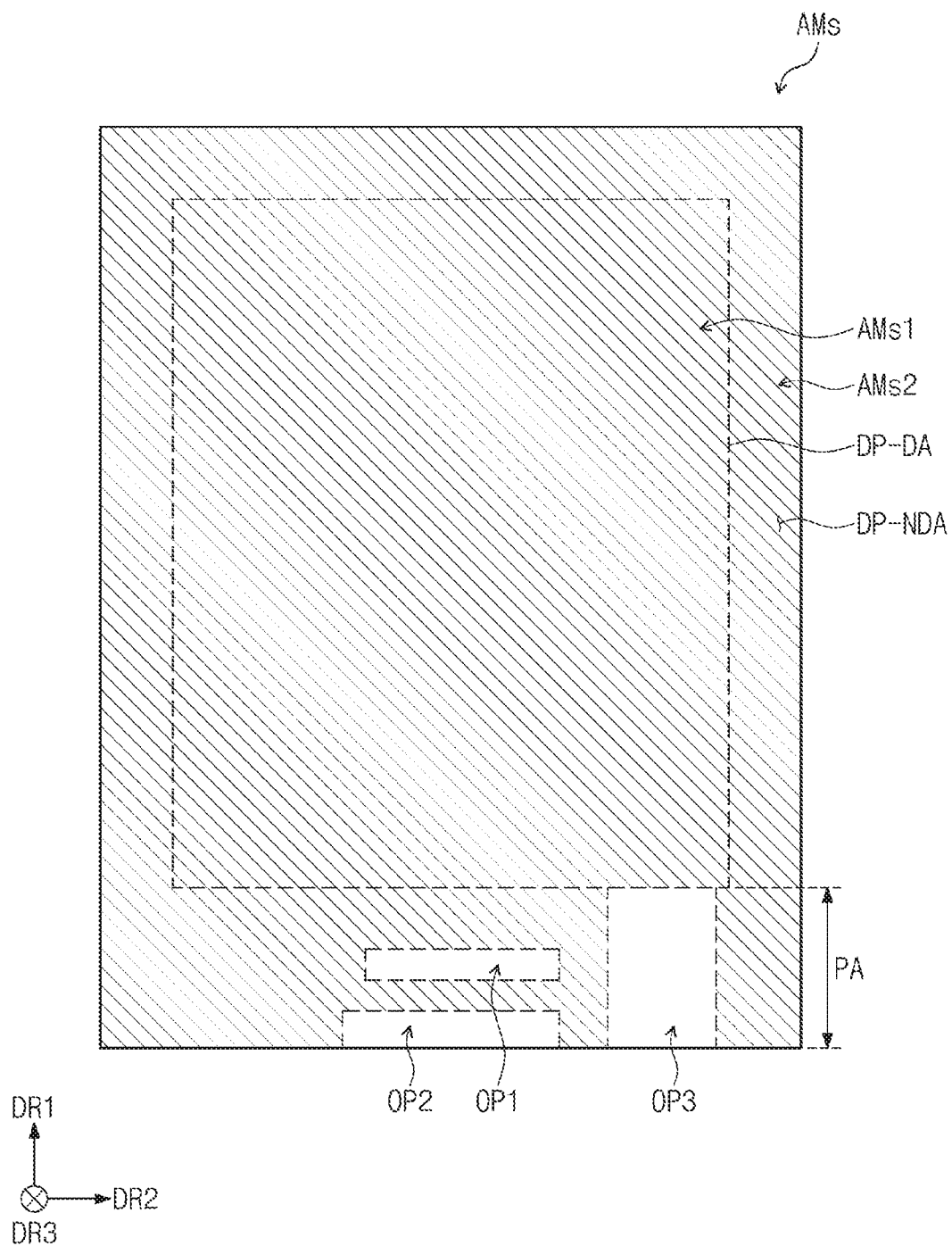
FIG. 10 is a plan view of an adhesive member according to some exemplary embodiments.

FIG. 8 is a sectional view of a display device according to some exemplary embodiments. FIG. 9 is a plan view of an input sensing unit according to some exemplary embodiments. FIG. 10 is a plan view of an adhesive member according to some exemplary embodiments.

The input sensing unit ISU may be provided on the encapsulation substrate EN. The input sensing unit ISU may include a first conductive layer IS-CL1, a first input sensing insulating layer IS-IL1 on the first conductive layer IS-CL1, a second conductive layer IS-CL2 on the first input sensing insulating layer IS-IL1, and a second input sensing insulating layer IS-IL2 on the second conductive layer IS-CL2. Each of the first and second conductive layers IS-CL1 and IS-CL2 may have a single-layered structure or a multi-layered structure including a plurality of layers stacked in the third direction DR3.

Each of the first and second conductive layers IS-CL1 and IS-CL2 may include a plurality of patterns. The description that follows will refer to an example in which the first conductive layer IS-CL1 includes first conductive patterns and the second conductive layer IS-CL2 includes second conductive patterns. Each of the first and second conductive patterns may include input sensing electrodes and signal lines.

As seen in FIG. 8, the encapsulation substrate EN may be provided on the display element layer ED similar to the structure previously described with reference to FIG. 4, but exemplary embodiments are not limited thereto. As an example, in the display device DD of FIG. 8, the encapsulation substrate EN may be provided in the form of a thin encapsulation layer. The thin encapsulation layer may include at least one insulating layer. The thin encapsulation layer may include at least one inorganic layer (hereinafter, an encapsulation inorganic layer). The thin encapsulation layer may include at least one organic layer (hereinafter, an encapsulation organic layer) and at least one encapsulation inorganic layer. That is, in some exemplary embodiments, an encapsulation member covering the display element layer ED of the display panel DP may include one of an encapsulation substrate and a thin encapsulation layer.\

Referring to FIG. 9, the input sensing unit ISU may include an active region AR, which corresponds to the display region DP-DA shown in FIG. 5 and is configured to sense an external input, and a non-active region NAR, which is provided to surround the active region AR. In some exemplary embodiments, the non-active region NAR may be locally provided near only a side portion of the active region AR or may be omitted.

The input sensing unit ISU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

The first sensing electrodes IE1-1 to IE1-5 and the second sensing electrodes IE2-1 to IE2-4 may be provided to cross each other. The first sensing electrodes IE1-1 to IE1-5 may be arranged in the first direction DR1 and each of the first sensing electrodes IE1-1 to IE1-5 may extend in the second direction DR2. The first and second sensing electrodes IE1-1 to IE1-5 and IE2-1 to IE2-4 may be configured to sense an external input in a mutual-capacitance manner and/or a self-capacitance manner. In some exemplary embodiments, during a first period, coordinates of an external input may be calculated (or determined) in the mutual-capacitance manner, and during a second period, the coordinates of the external input may be re-calculated (or re-determined) in the self-capacitance manner.

Each of the first sensing electrodes IE1-1 to IE1-5 may include first sensor units SP1 and first connecting portions CP1. Each of the second sensing electrodes IE2-1 to IE2-4 may include second sensor units SP2 and second connecting portions CP2. Each of two opposite ones of the first sensor units SP1 may have a smaller area or size (e.g., half area) as compared with a central one of the first sensor units SP1. Each of two opposite ones of the second sensor units SP2 may have a smaller area or size (e.g., half area) as compared with a central one of the second sensor units SP2.

Exemplary embodiments are not limited to the shapes of the first sensing electrodes IE1-1 to IE1-5 and the second sensing electrodes IE2-1 to IE2-4 shown in FIG. 9. In some exemplary embodiments, the first sensing electrodes IE1-1 to IE1-5 and the second sensing electrodes IE2-1 to IE2-4 may have a shape (e.g., a bar shape), in which distinction between the sensor unit and the connecting portion is not apparent or not allowed. Although each of the first and second sensor units SP1 and SP2 are illustrated to have a diamond shape, exemplary embodiments are not limited thereto. For example, each of the first and second sensor units SP1 and SP2 may have at least one of other polygonal shapes, except for the diamond shape.

The first signal lines SL1-1 to SL1-5 may be overlapped with the non-active region NAR. The first signal lines SL1-1 to SL1-5 may be respectively connected to the first sensing electrodes IE1-1 to IE1-5 and sensing pads, which are provided in a sensing pad region TC-PD. The sensing pads in the sensing pad region TC-PD may be provided on the non-active region NAR. The second signal lines SL2-1 to SL2-4 may be overlapped with the non-active region NAR. The second signal lines SL2-1 to SL2-4 may be respectively connected to the second sensing electrodes IE2-1 to IE2-4 and sensing pads, which are provided in the sensing pad region TC-PD.

In some exemplary embodiments, a portion of an input sensing circuit board (e.g., circuit board FPC) may be provided on the sensing pad region TC-PD. In other words, the sensing pads in the sensing pad region TC-PD may be electrically connected to the input sensing circuit board (e.g., circuit board FPC) and may be used to transmit electrical signals, which are transmitted from the input sensing circuit board (e.g., circuit board FPC), to the first signal lines SL1-1 to SL1-5 and the second signal lines SL2-1 to SL2-4. In this manner, the input sensing circuit board (e.g., circuit board FPC) may include a corresponding sensing pad region TC_PDz that is connected to the sensing pad region TC-PD of the input sensing unit ISU.

Referring to FIG. 10, except for structural differences associated with a third opening OP3, an adhesive member AMs may have substantially the same structure as the adhesive member AM shown in FIG. 7. The first opening OP1 and the second opening OP2 of FIG. 10 may also be overlapped with the driving chip DC and the pad PD, respectively, of the display panel DP described with reference to FIG. 6A.

For example, when viewed in a plan view, the adhesive member AMs may include a first adhesion portion AMs1 overlapped with the display region DP-DA and a second adhesion portion AMs2 overlapped with the non-display region DP-NDA. The second adhesion portion AMs2 may be a portion extended from the first adhesion portion AMs1, and for example, the first adhesion portion AMs1 and the second adhesion portion AMs2 may be provided in the form of a single body.

Furthermore, as shown in FIG. 10, the active region AR and the non-active region NAR may be overlapped with the display region DP-DA. In other words, the input sensing circuit board (e.g., circuit board FPC) may be overlapped with the non-display region DP-NDA of FIG. 6A and may be attached to a portion of the non-active region NAR of the input sensing unit ISU. In addition to the first and second openings OP1 and OP2 respectively provided with the driving chip DC and the pad PD, the second adhesion portion AMs2 may be provided to have a third opening OP3, in which the input sensing circuit board (e.g., circuit board FPC) is provided.

Figure 11:
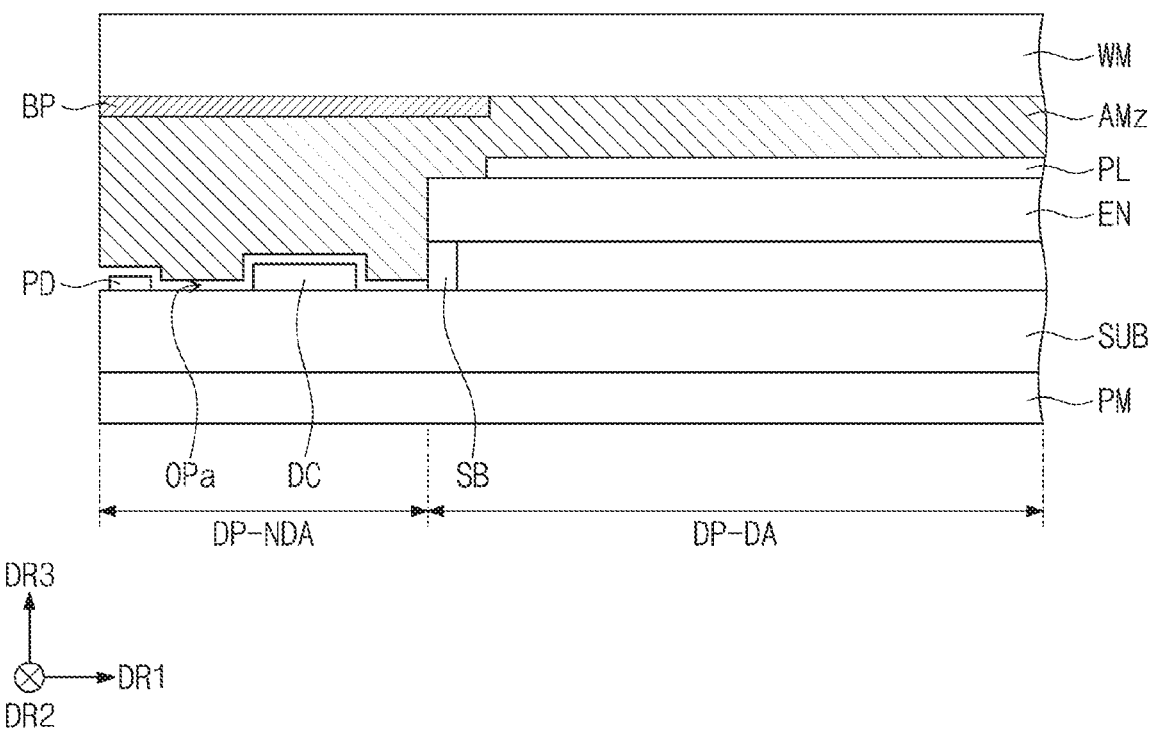
FIG. 11 is a sectional view taken along sectional line I-I' of FIG. 2 according to some exemplary embodiments.
Figure 12:
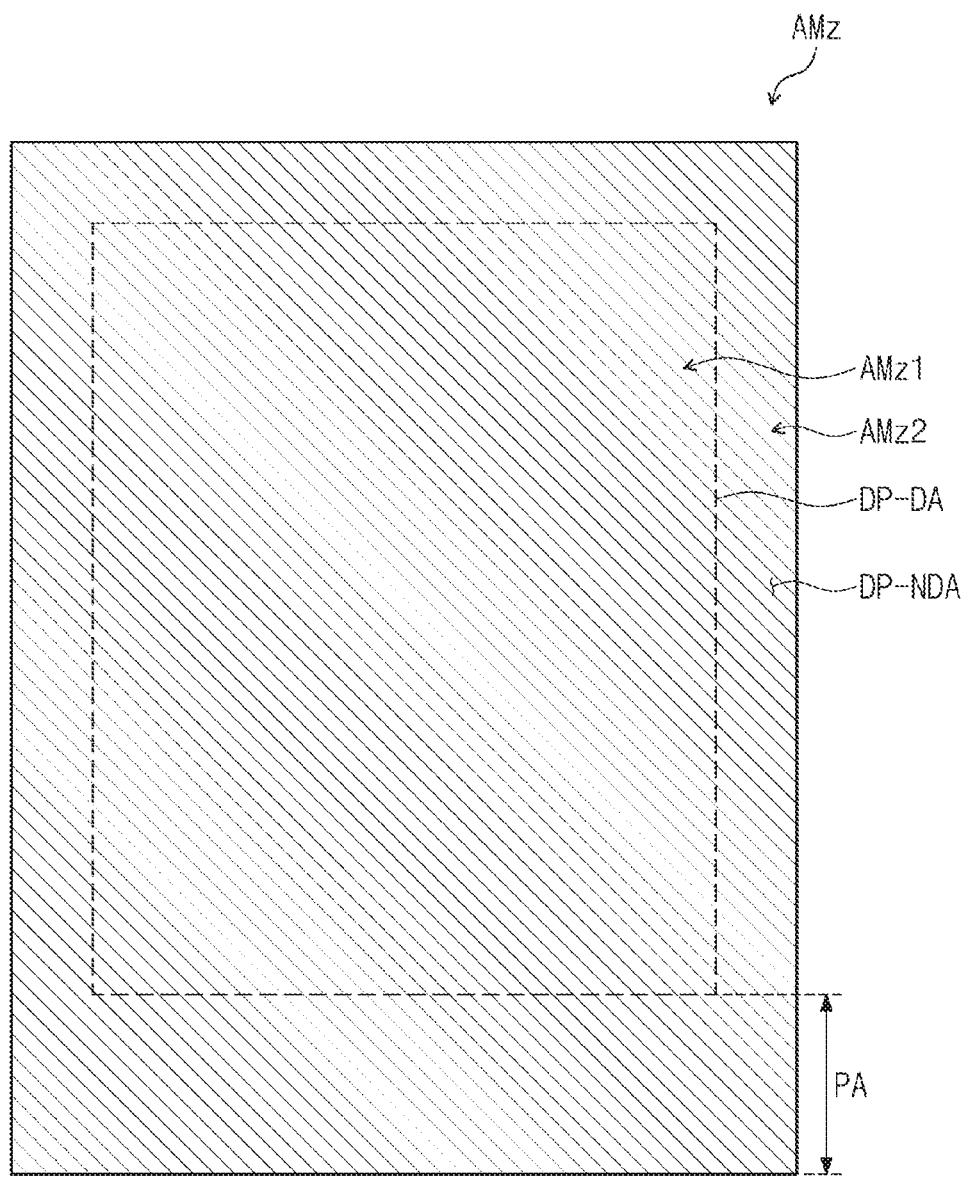
FIG. 12 is a plan view of an input sensing unit according to some exemplary embodiments.

FIG. 11 is a sectional view taken along sectional line I-I' of FIG. 2 according to some exemplary embodiments. FIG. 12 is a plan view of an input sensing unit according to some exemplary embodiments. Except for some differences associated with an adhesive member AMz, a display device shown in FIGS. 11 and 12 may be configured substantially the same as the display device shown in FIGS. 6A and 7. Thus, description of other elements, except for the adhesive member AMz, may be omitted.

Referring to FIGS. 11 and 12, the adhesive member AMz may include a first adhesion portion AMz1 overlapped with the display region DP-DA and a second adhesion portion AMz2 overlapped with the non-display region DP-NDA. The first adhesion portion AMz1 may be used to attach the polarization member PL to the window member WM. In addition, the first adhesion portion AMz1 may be provided to connect the window member WM to a portion of a top surface of the encapsulation substrate EN. The first adhesion portion AMz1 may be used to attach a portion of the top surface of the encapsulation substrate EN to the window member WM. In this case, the first adhesion portion AMz1 may be provided to substantially fill a space between a portion of the window member WM overlapped with the display region DP-DA and the polarization member PL or the encapsulation substrate EN.

In some exemplary embodiments, the second adhesion portion AMz2 may be connected to the window member WM, but may be spaced apart from the substrate SUB by a specific distance in the thickness direction. For instance, a space OPa may be formed between the second adhesion portion AMz2 and the substrate SUB. In this case, the adhesive member AMz may be firstly formed on the window member WM, and then, the display panel DP may be attached to the window member WM. This will be described in more detail with reference to FIGS. 15A to 15C.

According to some exemplary embodiments, since the second adhesion portion AMz2 may not be in contact with each of the driving chip DC and the pad PD, it may be possible to prevent the driving chip DC and the pad PD from being contaminated by a part or ingredient of an adhesive material. Furthermore, it may be possible to prevent the driving chip DC and the pad PD from being damaged, and thereby, to improve reliability of a display device.

Furthermore, when viewed in a plan view, the second adhesion portion AMz2 may be overlapped with the non-display region DP-NDA on the whole. As shown in FIG. 11, the first adhesion portion AMz1 may be provided to be in contact with a top surface of the encapsulation substrate EN on the whole, and the second adhesion portion AMz2 may be provided to be in contact with a side surface of the encapsulation substrate EN on the whole. Thus, the encapsulation substrate EN may be prevented from being damaged by an external impact.

Figure 13:
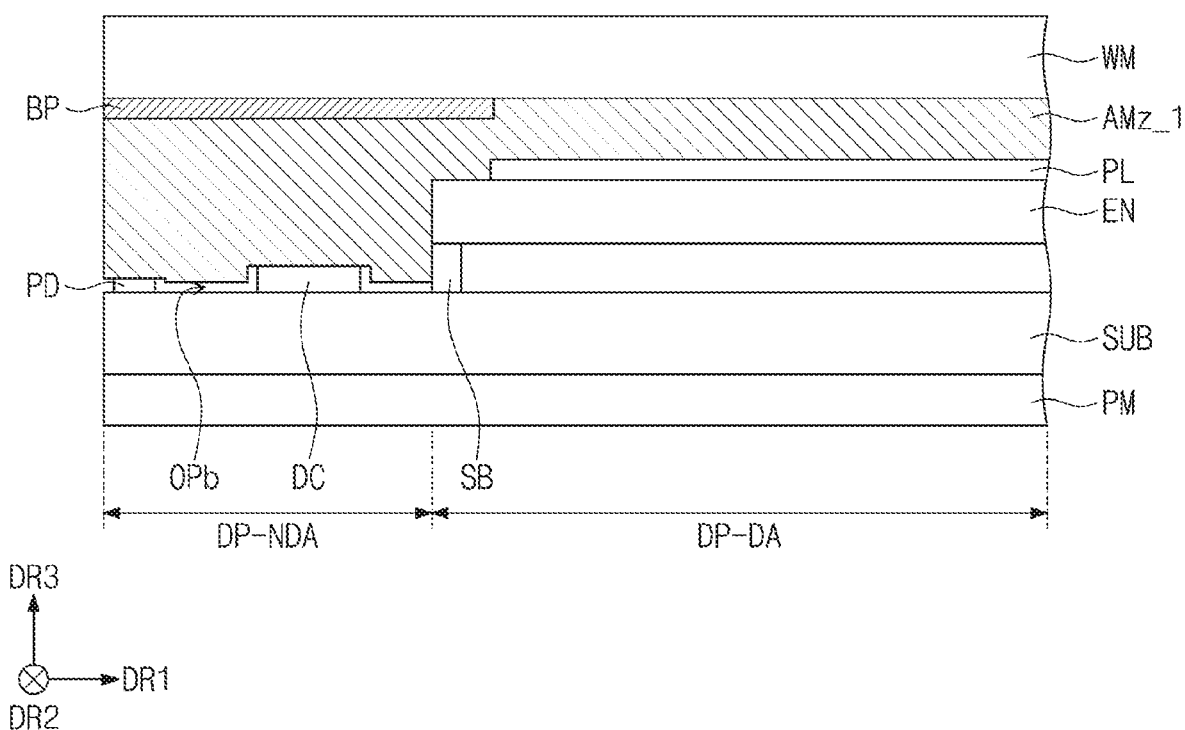
FIG. 13 is a sectional view taken along sectional line I-I' of FIG. 2 according to some exemplary embodiments.

FIG. 13 is a sectional view taken along sectional line I-I' of FIG. 2 according to some exemplary embodiments. Except for some differences associated with an adhesive member AMz_1, a display device shown in FIG. 13 may be configured substantially the same as the display device shown in FIGS. 6A, 7, 11, and 12. Thus, description of other elements, except for the adhesive member AMz_1, may be omitted.

As shown in FIG. 13, a second adhesion portion of an adhesive member AMz_1 may be spaced apart from the substrate SUB by a specific distance, but may be in contact with top surfaces of the driving chip DC and the pad PD. The second adhesion portion of the adhesive member AMz_1 may be in contact with each of the top surfaces of the driving chip DC and the pad PD, but may not be in contact with side surfaces of the driving chip DC and the pad PD. As an example, a protection layer may be provided on the top surfaces of the driving chip DC and the pad PD to prevent external moisture or a contamination material from entering the driving chip DC and the pad PD. For instance, a space OPa may be formed between the second adhesion portion and the substrate SUB.

Figure 14:
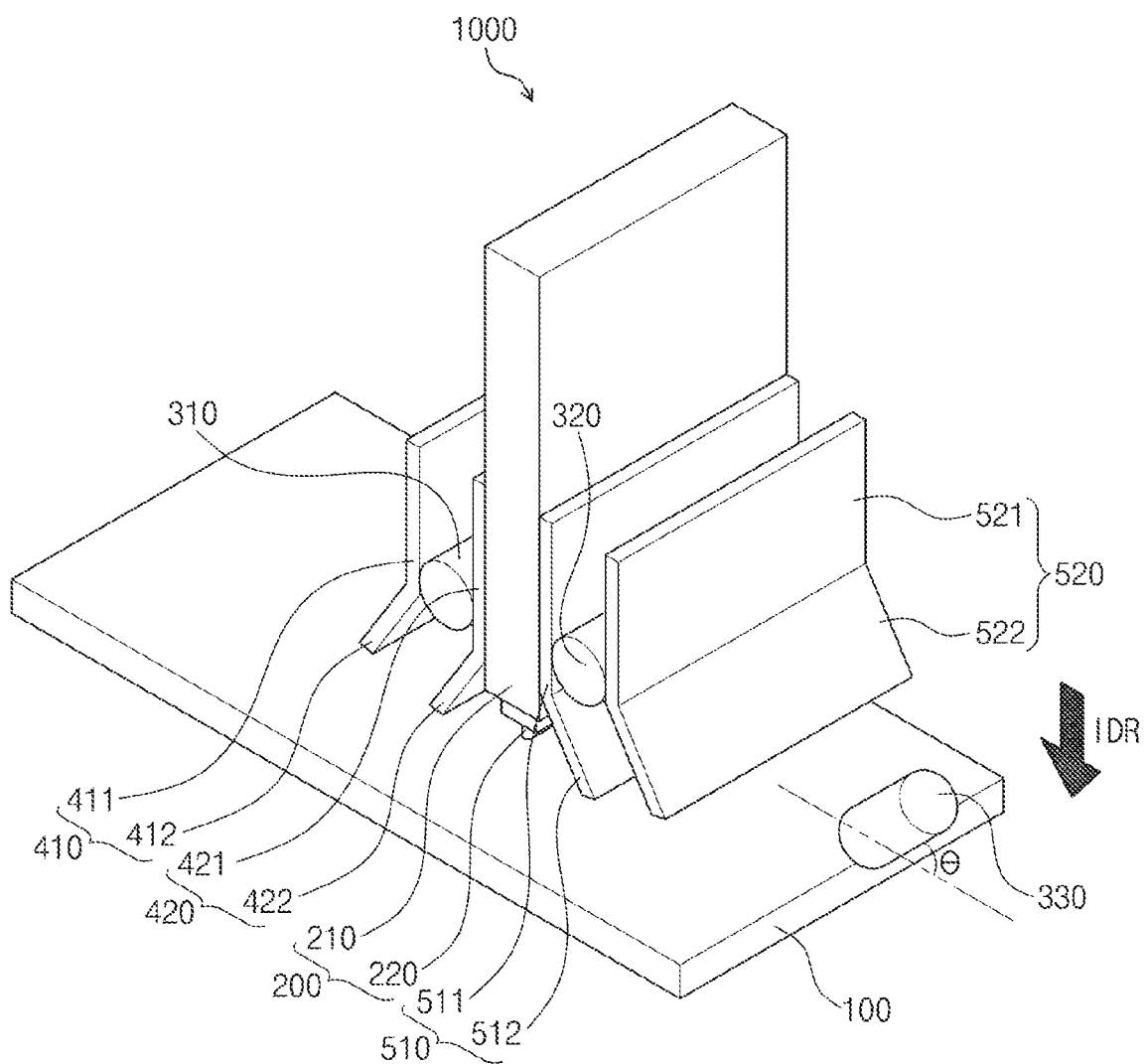
FIG. 14 is a perspective view of an inkjet printer according to some exemplary embodiments.
Figure 14:
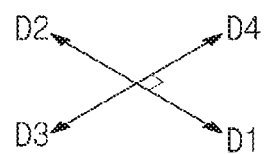

FIG. 14 is a perspective view of an inkjet printer according to some exemplary embodiments.

As shown in FIG. 14, an inkjet printer 1000 may include a stage 100, an inkjet head 200, a first ultraviolet (UV) irradiation device 310, a second UV irradiation device 320, a third UV irradiation device 330, first covers 410 and 420, and second covers 510 and 520.

The stage 100 may be provided in the form of a plate. Although the stage 100 is illustrated to be rectangular when viewed in a plan view, exemplary embodiments are not limited to a planar shape or size of the stage 100. The stage 100 may provide a space in which a substrate is placed, loaded, or otherwise supported.

The inkjet head 200 may be provided over the stage 100. The inkjet head 200 may be spaced apart from a top surface of the stage 100 by a specific distance. The inkjet head 200 may include a body portion 210 and a nozzle 220, which is provided under the body portion 210 and is exposed to the outside. In some exemplary embodiments, the inkjet head 200 may include a plurality of nozzles 220, which are arranged in at least one column, and the column of the nozzles 220 may be parallel to a direction D3 or D4 crossing a first direction D1 and an ink ejection direction IDR.

In addition, the nozzles 220 of the inkjet head 200 may be independently controlled by a control unit (not shown). The control unit may be configured to control an amount of ink to be ejected through each of the nozzles 220, and this may make it possible to form a desired shape of an ink pattern on a substrate. Furthermore, an ink storage (not shown), in which the ink to be ejected on the substrate is stored, may be provided in the inkjet head 200. The inkjet head 200 may be configured to be movable in at least two opposite directions (e.g., first and second directions D1 and D2).

The first UV irradiation device 310 may be placed behind the inkjet head 200 in the second direction D2. The first UV irradiation device 310 may include a plurality of light sources, which are spaced apart from each other in the direction D3 or D4 crossing the second direction D2 and the ink ejection direction IDR, but exemplary embodiments are not limited thereto. In some exemplary embodiments, the first UV irradiation device 310 and the inkjet head 200 may be provided to constitute a single body structure. In this case, a direction of motion of the first UV irradiation device 310 may be the same as that of the inkjet head 200.

In a case where the inkjet head 200 moves in the first direction D1, the first UV irradiation device 310 may emit ultraviolet light to harden an ink. The inkjet head 200 may move in the first direction DR1 and may eject an ink onto the substrate through the nozzle 220. Immediately on coating the substrate with the ejected ink, the ejected ink may be hardened by the ultraviolet light emitted from the first UV irradiation device 310.

The first covers 410 and 420 may be provided on both side portions of the first UV irradiation device 310 facing each other in the first direction D1. The first covers 410 and 420 may include upper portions 411 and 421, respectively, which are provided to cover opposite side portions of the first UV irradiation device 310. The upper portions 411 and 421 of the first covers 410 and 420 may be provided to fully cover the side portions of the first UV irradiation device 310 facing each other in the first direction DR1. Although each of the upper portions 411 and 421 is illustrated to have a rectangular shape when viewed in a plan view, exemplary embodiments are not limited to specific planar shapes of the upper portions 411 and 421 if the side portions of the first UV irradiation device 310 facing each other in the first direction D1 are fully covered by the upper portions 411 and 421.

The first covers 410 and 420 may include lower portions 412 and 422, which are extended from ends of the upper portions 411 and 421, respectively, and are inclined toward the second direction DR2. The lower portions 412 and 422 of the first covers 410 and 420 may be configured to allow the ultraviolet light, which is provided from the first UV irradiation device 310, to propagate in a direction inclined at an angle to the ink ejection direction IDR. Thus, even when a portion of the ejected ink is not formed on a desired region of the substrate, it may be possible to prevent such a portion of the ejected ink from being irradiated with the ultraviolet light and from being hardened.

The second UV irradiation device 320 may be placed behind the inkjet head 200 in the first direction D1. The second UV irradiation device 320 may include a plurality of light sources, which are spaced apart from each other in the direction D3 or D4 crossing the second direction D2 and the ink ejection direction IDR, but exemplary embodiments are not limited thereto. In some exemplary embodiments, the second UV irradiation device 320 and the inkjet head 200 may be provided to constitute a single body structure. In this case, a direction of motion of the second UV irradiation device 320 may be the same as that of the inkjet head 200.

In a case where the inkjet head 200 moves in the second direction D2, the second UV irradiation device 320 may emit ultraviolet light to harden an ink. The inkjet head 200 may move in the second direction D2 and may eject an ink onto the substrate through the nozzle 220, and immediately on coating the substrate with the ejected ink, the ejected ink may be hardened by the ultraviolet light emitted from the second UV irradiation device 320.

The second covers 510 and 520 may be provided on both side portions of the second UV irradiation device 320 facing each other in the second direction D2. The second covers 510 and 520 may include upper portions 511 and 521, respectively, which are provided to cover opposite side portions of the second UV irradiation device 320. The upper portions 511 and 521 of the second covers 510 and 520 may be provided to fully cover the side portions of the second UV irradiation device 320 facing each other in the second direction D2. Although each of the upper portions 511 and 521 is illustrated to have a rectangular shape when viewed in a plan view, exemplary embodiments are not limited to specific planar shapes of the upper portions 511 and 521 if the side portions of the second UV irradiation device 320 facing each other in the second direction D2 are fully covered by the upper portions 511 and 521.

The second covers 510 and 520 may include lower portions 512 and 522, which are extended from ends of the upper portions 511 and 521, respectively, and are inclined toward the first direction DR1. The lower portions 512 and 522 of the second covers 510 and 520 may be configured to allow the ultraviolet light, which is provided from the second UV irradiation device 320, to propagate in a direction inclined at an angle to the ink ejection direction IDR. Thus, even when a portion of the ejected ink is not formed on a desired region of the substrate, it may be possible to prevent such a portion of the ejected ink from being irradiated with the ultraviolet light and from being hardened.

The third UV irradiation device 330 may be spaced apart from a side surface of the stage 100 by a specific distance in the first direction D1. Here, the third UV irradiation device 330 may be provided to be collinear with the first UV irradiation device 310 and the second UV irradiation device 320, but exemplary embodiments are not limited thereto. The third UV irradiation device 330 may be provided to be inclined at an angle θ relative to the first direction D1. In the case where an ink is ejected on a region of a substrate adjacent to the third UV irradiation device 330, the ink may be quickly hardened by an ultraviolet light emitted from the third UV irradiation device 330.

Figure 15A:
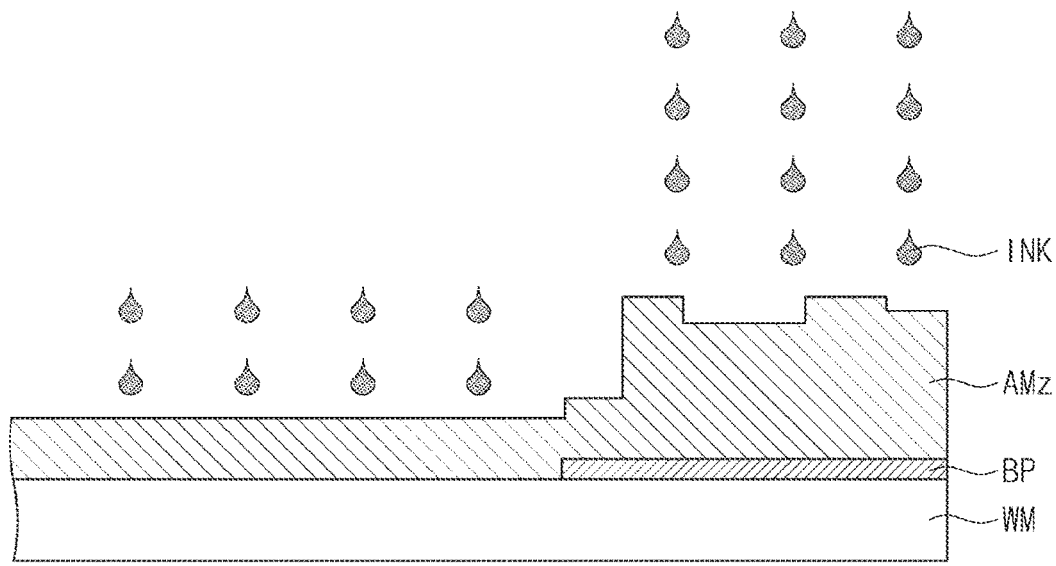
FIGS. 15A, 15B, and 15C are sectional views of a display device at various stages of fabrication according to some exemplary embodiments.
Figure 15A:
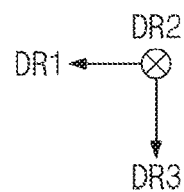
Figure 15B:
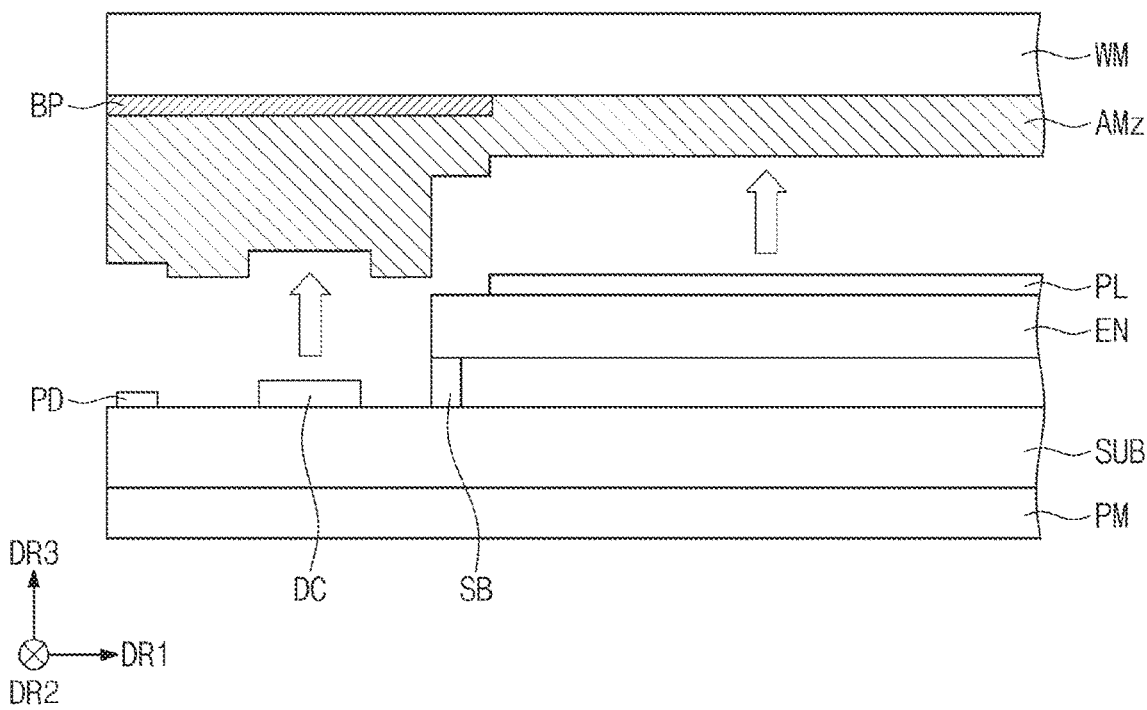
Figure 15C:
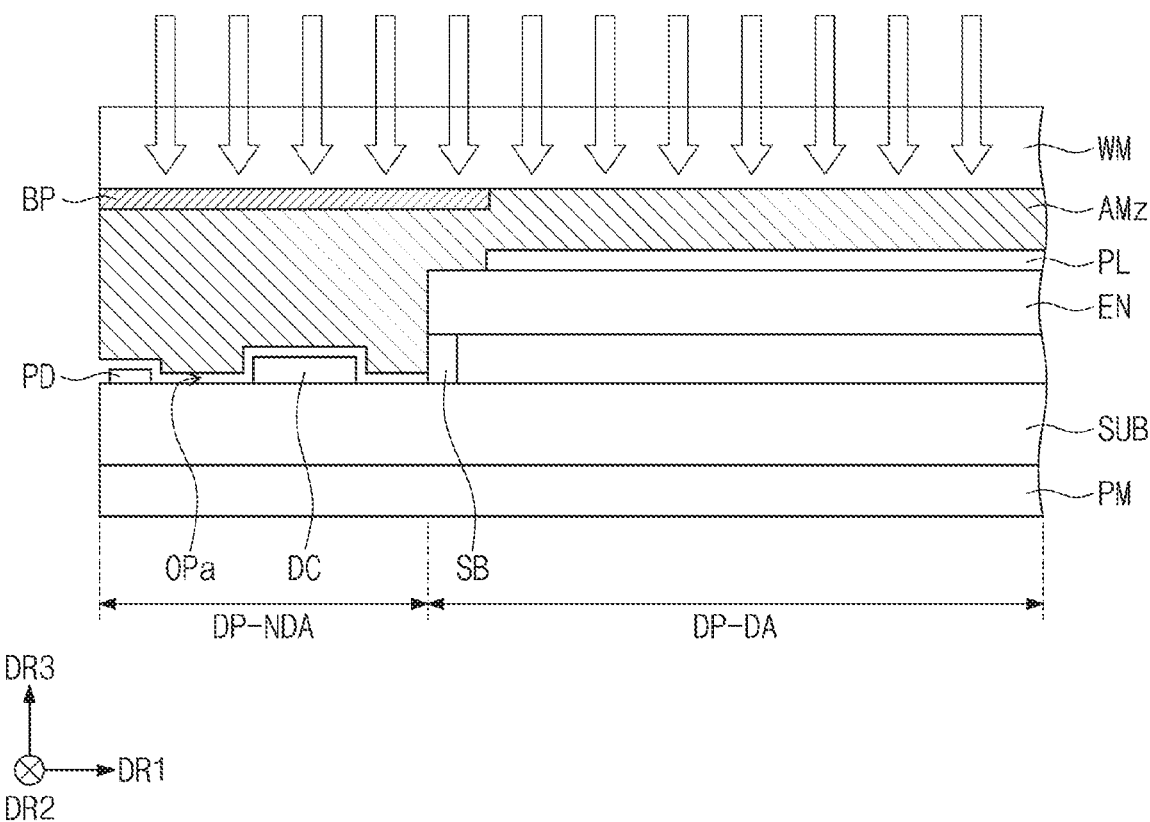

FIGS. 15A, 15B, and 15C are sectional views of a display device at various stages of fabrication according to some exemplary embodiments. Accordingly, a method of manufacturing a display device according to some exemplary embodiments will be described in association with FIGS. 11 and 15A to 15C. For example, the adhesive member AMz shown in FIG. 11 may be formed on the window member WM and then may be used to attach the window member WM to the display panel DP.

For instance, referring to FIG. 15A, the inkjet printer 1000 described with reference to FIG. 14 may be used to form the adhesive member AMz on a rear surface of the window member WM. In this case, an ink INK ejected from the inkjet printer 1000 may be deposited on the window member WM and then may be immediately hardened. Here, the ink INK may be an optically clear resin (OCR).

For example, as shown in FIGS. 11, 12, and 15A, the inkjet printer 1000 may be used to form the first adhesion portion AMz1 and the second adhesion portion AMz2, which are respectively overlapped with the display region DP-DA and the non-display region DP-NDA, on the window member WM, and the first and second adhesion portions AMz1 and AMz2 may be formed to have thicknesses different from each other. For example, the ink INK may be ejected to have a larger thickness on a rear surface of the window member WM overlapped with the non-display region DP-NDA, and thus, the second adhesion portion AMz2 may be formed to be thicker than the first adhesion portion AMz1. According to some exemplary embodiments, the inkjet printer 1000 may be used to form the second adhesion portion AMz2, which is spaced apart from the substrate SUB by a specific distance, on the window member WM.

Referring to FIG. 15B, the display panel DP may be coupled to the window member WM attached with the adhesive member AMz.

Thereafter, referring to FIG. 15C, the adhesive member AMz between the window member WM and the display panel DP may be re-hardened. Owing to the re-hardening of the adhesive member AMz, it may be possible to more robustly bond the window member WM to the display panel DP.

According to various exemplary embodiments, an adhesive member overlapped with a non-display region may be provided to connect a window member to a substrate. Due to the adhesive member connecting the window member to the substrate, it may be possible to relieve a magnitude of an external impact exerted on a substrate and an encapsulation substrate provided on the substrate. Thus, reliability of a display device may be improved.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
    a display panel comprising a display region and a non-display region;
    a window member on the display panel; and
    an adhesive member between the display panel and the window member, the adhesive member comprising:
        a first adhesion portion overlapping with the display region in a plan view; and
        a second adhesion portion extending from the first adhesion portion and overlapping with the non-display region in the plan view,
    wherein the display panel comprises:
        a substrate;
        a display element layer on the substrate and overlapping with the display region;
        a driving chip on the substrate and overlapping with the non-display region, the driving chip being configured to provide a driving signal to the display element layer;
        a pad region comprising pads on the substrate, the pads being electrically connected to the driving chip, the driving chip being, when viewed in the plan view, between the display region and the pad region; and
        an encapsulation member on the display element layer,
    wherein, in the plan view, the window member overlaps with the driving chip and the second adhesion portion,
    wherein the first adhesion portion connects the window member to the encapsulation member,
    wherein the second adhesion portion is integrally formed with the first adhesion portion and attaches the window member to the substrate,
    wherein the second adhesion portion encloses the driving chip,
    wherein the second adhesion portion comprises:
        a first opening overlapping with the driving chip in the plan view; and
        a second opening exposing the pad region, the second opening being, when viewed in the plan view, spaced apart from the first opening; and
        a third opening exposing an input sensing circuit,
    wherein, when viewed in the plan view, the second adhesion portion is spaced apart from the driving chip and the pads,
    wherein the first opening is parallel to the second opening when viewed in the plan view,
    wherein the first opening and the second opening are provided in the second adhesion portion and not in the first adhesion portion,
    wherein the third opening is perpendicular to the first and second openings when viewed in the plan view, in which the third opening extends across an entire width of the second adhesion portion to an edge of the first adhesion portion.

2. The display device of claim 1, wherein:
    the first adhesion portion is in contact with a top surface of the encapsulation member; and
    the second adhesion portion is in contact with a side surface of side surfaces of the encapsulation member, the side surface being adjacent to the driving chip, the second adhesion portion being in contact with a portion of the top surface.

3. The display device of claim 1, wherein:
    when viewed in the plan view, the second adhesion portion overlaps with a region between the pad region and a chip region on which the driving chip is disposed.

4. The display device of claim 1, further comprising:
    a polarization member on the encapsulation member and overlapping with the display region,
    wherein the first adhesion portion comprises:
        a first portion connecting the polarization member to the window member; and
        a second portion extending from the first portion and connecting a portion of a top surface of the encapsulation member to the window member.

5. The display device of claim 1, further comprising:
    the input sensing circuit on the encapsulation member; and
    a circuit board on the encapsulation member, the circuit board being configured to provide a sensing driving signal to the input sensing circuit.

6. The display device of claim 5, wherein, when viewed in the plan view, the second adhesion portion does not overlap with the circuit board.

7. The display device of claim 1, further comprising:
    a light blocking member on the display panel,
    wherein, in the plan view, the light blocking member overlaps with the driving chip.

8. The display device of claim 7, wherein a void is formed between the light blocking member and the driving chip.

9. The display device of claim 7, wherein the light blocking member is between the window member and the display panel.

10. The display device of claim 7, wherein, in the plan view, the light blocking member overlaps with the second adhesion portion.

11. The display device of claim 1, wherein:
    the display panel further comprises a seal member connecting the encapsulation member to the substrate; and
    the second adhesion portion contacts a first side surface of the seal member.

12. The display device of claim 11, wherein:
    a second side surface of the seal member interfaces with an internal space formed between the substrate and the encapsulation member; and
    the first side surface of the seal member opposes the second side surface of the seal member.

* * * * *